United States Patent [19]

Tsai et al.

[11] Patent Number: 5,726,091
[45] Date of Patent: Mar. 10, 1998

[54] METHOD OF REDUCING BIRD'S BEAK OF FIELD OXIDE USING REOXIDIZED NITRIDED PAD OXIDE LAYER

[75] Inventors: Chao-Chieh Tsai, Taichung; Shun-Liang Hsu, Hsin-Chu, both of Taiwan

[73] Assignee: Taiwan Semiconductor Manufacturing Company, Ltd., Hsin-Chu, Taiwan

[21] Appl. No.: 705,451

[22] Filed: Aug. 29, 1996

[51] Int. Cl.⁶ .................................................. H01L 21/76
[52] U.S. Cl. ............................................ 438/439; 438/775
[58] Field of Search ........................... 438/439, 775, 438/229, 230, 232

[56] References Cited

U.S. PATENT DOCUMENTS

| | | |
|---|---|---|
| 4,764,248 | 8/1988 | Bhattacherjee et al. |
| 4,965,221 | 10/1990 | Dennison et al. ............... 437/70 |
| 5,369,051 | 11/1994 | Rao et al. ....................... 437/69 |
| 5,429,982 | 7/1995 | Chao ............................... 437/69 |
| 5,432,117 | 7/1995 | Yamamoto ....................... 437/69 |
| 5,447,885 | 9/1995 | Cho et al. ....................... 437/70 |

OTHER PUBLICATIONS

S.M.Sze, McGraw Hill Book Co. "VLSI Technology, International Edition", NY NY, 1988, pp. 473–474.

*Primary Examiner*—George R. Fourson
*Attorney, Agent, or Firm*—George O. Saile; Stephen B. Ackerman; Rosemary S.L. Pike

[57] ABSTRACT

A new method of local oxidation using an oxynitrided pad oxide layer to suppress the growth of a bird's beak is described. An oxide layer is provided over the surface of a semiconductor substrate. The oxide layer is annealed in a nitrogen atmosphere whereby the oxide layer is nitrided. The nitrided oxide layer is then reoxidized. A silicon nitride layer is deposited overlying the oxide layer. Portions of the silicon nitride and oxide layers not covered by a mask pattern are etched through to provide an opening exposing the portion of the semiconductor substrate that will form the field oxidation. The silicon substrate within the opening is oxidized wherein the semiconductor substrate is transformed to silicon dioxide wherein the nitrided oxide layer suppresses the formation of the bird's beak whereby the field oxidation is formed with a small bird's beak. The remaining oxide and silicon nitride layers are removed completing the field oxidation of the integrated circuit.

27 Claims, 4 Drawing Sheets

METHOD OF REDUCING BIRD'S BEAK OF FIELD OXIDE USING REOXIDIZED NITRIDED PAD OXIDE LAYER

BACKGROUND OF THE INVENTION

1. Field of the Invention

This invention relates to the fabrication of integrated circuit devices and more particularly to a method of local oxidation using an oxynitrided pad oxide layer to suppress growth of a bird's beak under field oxide in the fabrication of integrated circuits.

2. Description of the Prior Art

Local oxidation of silicon is the conventional lateral isolation scheme. The conventional local oxidation process (LOCOS) is described in *VLSI Technology*, International Edition, by S. M. Sze, McGraw-Hill Book Company, NY, N.Y., c. 1988 by McGraw-Hill Book Co., pp. 473–474. Referring to FIG. 1, a layer of silicon nitride 3 is deposited over a pad oxide 2 overlying a silicon substrate 1. The pad oxide is a thin thermal oxide which allows better adhesion between the nitride and silicon and acts as a stress relaxation layer during field oxide formation. The nitride and oxide layers are etched to leave openings 4 exposing portions of the silicon substrate where the local oxidation will take place. A boron channel-stop layer 5 is ion implanted into the isolation regions. Referring now to FIG. 2, the field oxide 6 is grown within the openings and the nitride and pad oxide layers are removed. This completes the local oxidation.

Bird's beak encroachment is a disadvantage of the conventional LOCOS method. Bird's beak encroachment 7 is caused by the lateral oxidation of silicon along the pad oxide under the nitride layer during the high temperature and long time required by the oxidation process.

Recessed etching before field oxidation and silicon nitride spacers 8, as illustrated in FIG. 3, have been used to reduce the bird's beak encroachment. However, these are complicated processes.

U.S. Pat. No. 4,965,221 to Dennison et al teaches the use of both recessed etching and spacers. U.S. Pat. No. 5,369,051 to Rao et al teaches the use of spacers. U.S. Pat. No. 5,432,117 to Yamamoto teaches the use of a thick silicon nitride layer with thinner edges to prevent bird's beak formation.

Other methods include the use of oxidation blocking films. U.S. Pat. No. 5,447,885 to Cho et al discloses the use of a silicon oxidation blocking film, then forming an oxynitride film by nitrification of native oxide. U.S. Pat. No. 5,429,982 to Chao teaches growing an oxide layer in a nitrogen ambient and annealing the oxide layer to form an oxynitride layer which reduces the bird's beak.

SUMMARY OF THE INVENTION

A principal object of the invention is to provide an effective and very manufacturable method to locally oxidize the silicon in an integrated circuit.

Another object of the present invention is to provide a method of local oxidation of silicon that will suppress the growth of a "bird's beak."

In accordance with the objects of this invention, a new method of local oxidation using an oxynitrided pad oxide layer to suppress the growth of a bird's beak is achieved. An oxide layer is provided over the surface of a semiconductor substrate. The oxide layer is annealed in a nitrogen atmosphere whereby the oxide layer is nitrided. The nitrided oxide layer is then reoxidized. A silicon nitride layer is deposited overlying the oxide layer. Portions of the silicon nitride and oxide layers not covered by a mask pattern are etched through to provide an opening exposing the portion of the semiconductor substrate that will form the field oxidation. The silicon substrate within the opening is oxidized wherein the semiconductor substrate is transformed to silicon dioxide wherein the nitrided oxide layer suppresses the formation of the bird's beak whereby the field oxidation is formed with a small bird's beak. The remaining oxide and silicon nitride layers are removed completing the field oxidation of the integrated circuit.

BRIEF DESCRIPTION OF THE DRAWINGS

In the accompanying drawings forming a material part of this description, there is shown.

DESCRIPTION OF THE PREFERRED EMBODIMENTS

Figure 1:
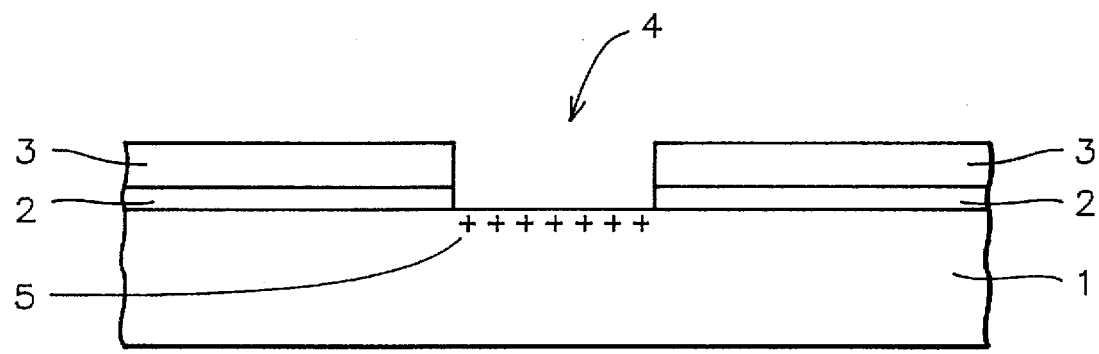
FIGS. 1 through 3 schematically illustrate in cross-sectional representation LOCOS processes of the prior art.
Figure 2:
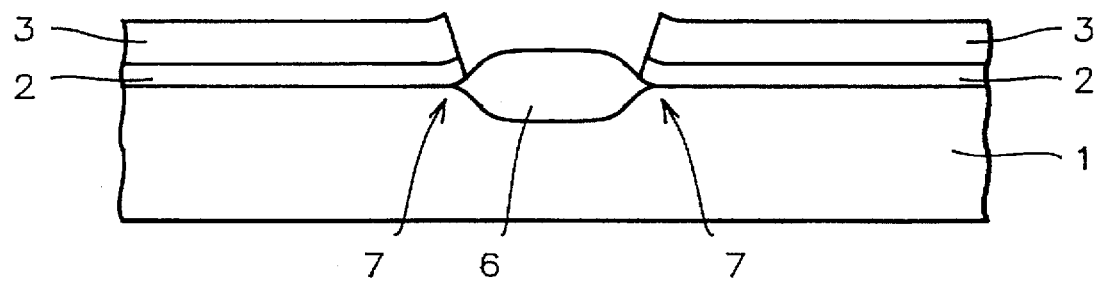
Figure 3:
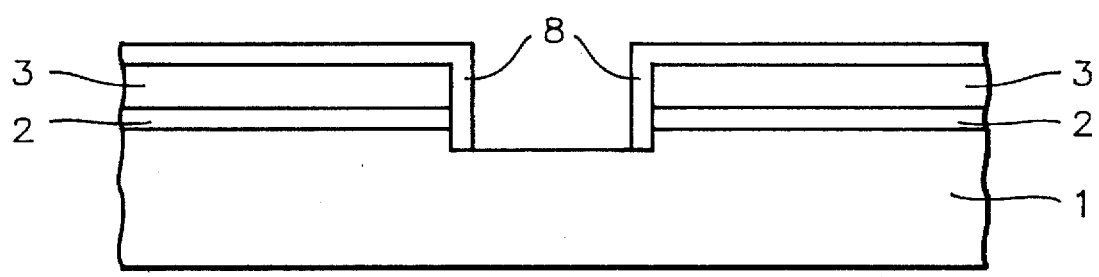
Figure 4:
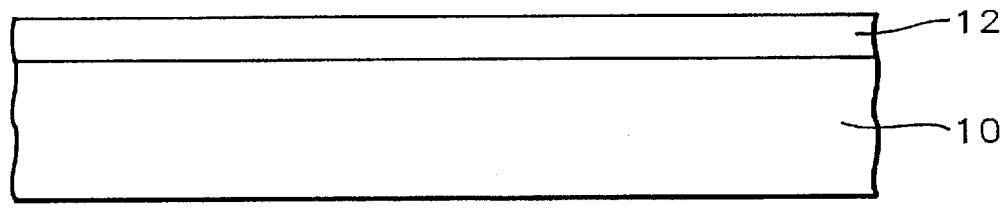
FIGS. 4 through 8 schematically illustrate in cross-sectional representation a preferred embodiment of the present invention.
Figure 5:
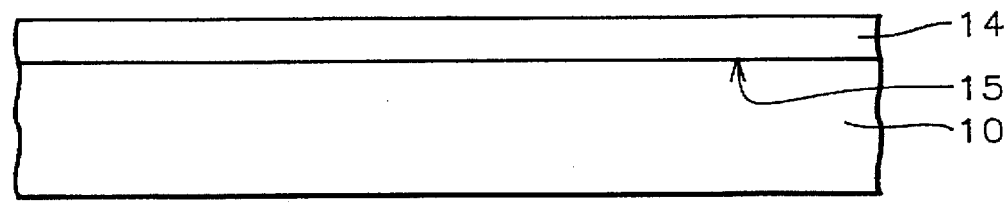
Figure 6:
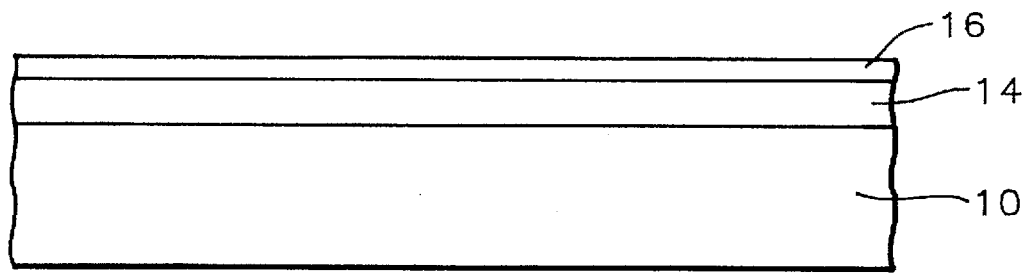

Referring now more particularly to FIGS. 4 through 6, the process of the invention will be described. Referring now to FIG. 4, there is shown a monocrystalline silicon substrate 10. A layer 12 of silicon dioxide is thermally grown on the surface of the substrate in dry oxygen at a temperature of between about 850° to 950° C. to a preferred thickness of between about 100 to 150 Angstroms. Growing the pad oxide in dry oxygen allows for better quality and thickness control. However, the oxide may be deposited by chemical vapor deposition (CVD) instead of grown.

The pad oxide layer 12 is annealed in a nitrogen ambient of $NH_3$ or NO at a temperature of between about 850° to 1200° C. for between about 10 to 80 minutes. This results in oxynitrided pad oxide layer 14, illustrated in FIG. 5. The entire layer 12 has been nitrided with variable nitrogen/oxygen ratio. There will be a pile up of nitrogen at the silicon interface, 15. The nitridation involves a growth in the oxide layer thickness of no more than about 10 to 40 Angstroms for an initial pad oxide thickness of between about 100 to 150 Angstroms. This is because oxidizer is difficult to diffuse in oxynitride and also because the nitrogen piled up at the silicon interface blocks further oxidation of the silicon substrate.

The oxynitrided pad oxide layer is reoxidized in an oxygen atmosphere at a temperature of between about 850° to 950° C. for between about 10 to 50 minutes. This reoxidation results in a better interface between the oxynitride and silicon and therefore reduces stress.

The properties of the oxynitrided layer 14 are a compromise between those of pure nitride and oxide with respect to the oxidation masking capability of nitride and the stress relief capability of oxide.

Referring now to FIG. 6, a layer of silicon nitride 16 is deposited over the oxynitrided layer 14 to a thickness of between about 1500 to 2000 Angstroms. The silicon nitride layer acts as an oxidation masking layer.

Figure 7:
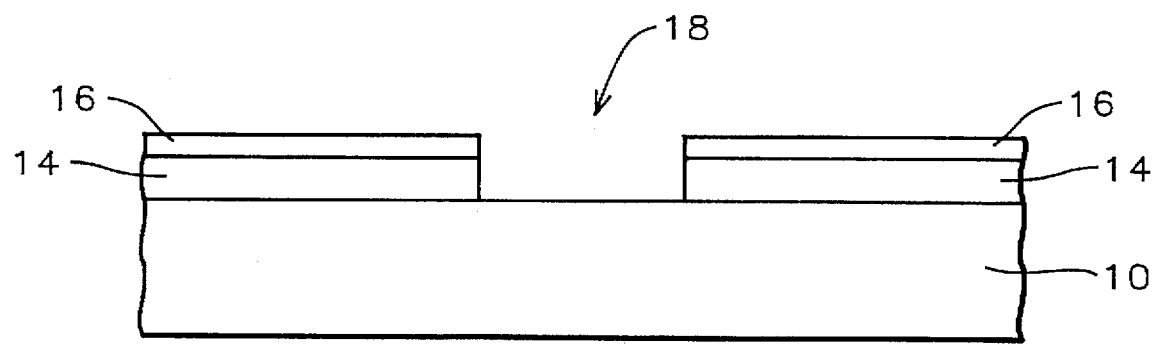

The silicon nitride layer 16 and oxynitrided pad oxide layer 14 are patterned to leave openings 18 exposing portions of the silicon substrate where the local oxidation will take place, as shown in FIG. 7.

Figure 8:
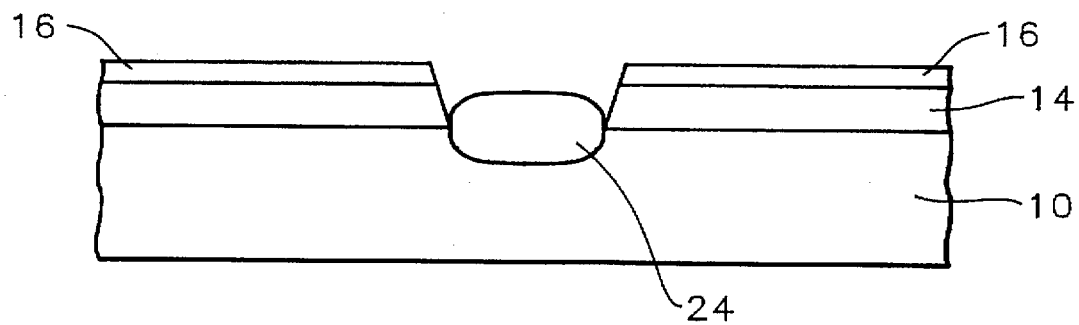

Referring now to FIG. 8, field oxidation is performed within the openings 18. The field oxidation is performed at a temperature of between about 1000° to 1200° C. for between about 2 to 3 hours in steam. Field oxide region 24 is formed.

The silicon nitride layer and the oxynitrided pad oxide layer are removed, such as by hot phosphoric acid and hydrofluoric acid.

This completes the local oxidation of the integrated circuit. The presence of the oxynitrided pad oxide layer 14 suppresses the growth of bird's beaks.

Figure 9:
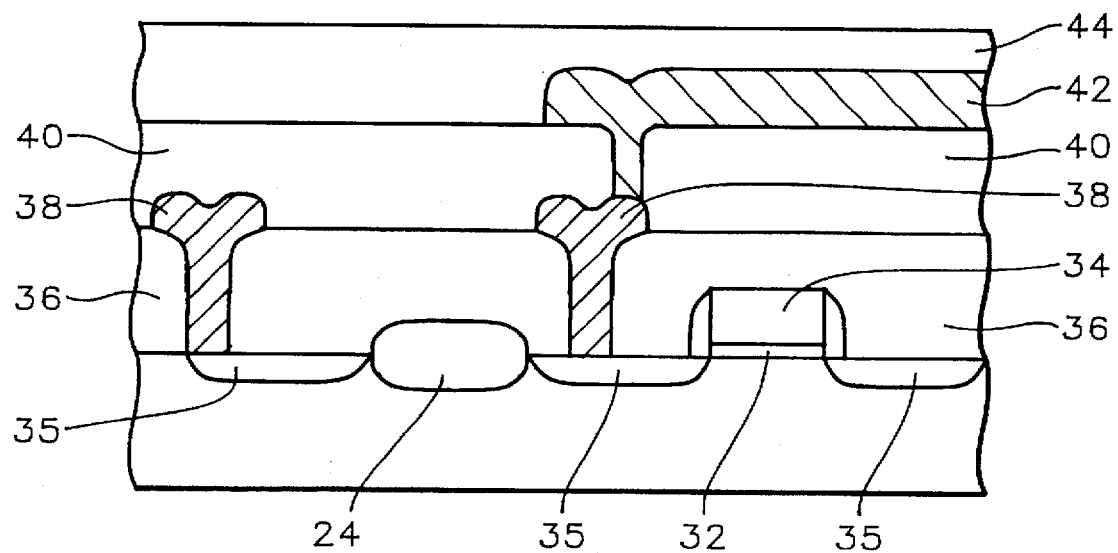
FIG. 9 schematically illustrates in cross-sectional representation a completed integrated circuit of the present invention.

The integrated circuit may be completed as is conventional in the art. For example, referring to FIG. 9, gate oxide layer 32 may be formed followed by patterning to provide openings for buried contact regions. A threshold-adjust ion implant may be required at this point or before the growth of the gate oxide layer 32. Next, gate electrode 34 and source/drain regions 35 are fabricated. Dielectric layer 36, which may be a phosphorus-doped chemical vapor deposited oxide or borophosphosilicate glass (BPSG) is deposited. Contact openings are etched through the dielectric layer to expose the source/drain regions where contacts are desired. Metal layer 38, typically aluminum, is deposited and patterned to complete contacts to the source/drain regions followed by the deposition of an intermetal dielectric layer 40. A second metallization 42 is deposited and patterned. A top capping layer 44 of silicon nitride and/or an oxide completes formation of the integrated circuit.

While the invention has been particularly shown and described with reference to the preferred embodiments thereof, it will be understood by those skilled in the art that various changes in form and details may be made without departing from the spirit and scope of the invention.

What is claimed is:

1. The method of forming a device isolation region of an integrated circuit comprising:

providing an oxide layer over the surface of a semiconductor substrate;

annealing said oxide layer in a nitrogen atmosphere whereby said oxide layer is nitrided and wherein nitrogen atoms pile up at the interface between said oxide layer and said surface of said semiconductor substrate;

reoxidizing said oxide layer;

depositing a silicon nitride layer overlying said oxide layer;

etching an opening through said silicon nitride layer and said oxide layer to said semiconductor substrate where said device isolation region is to be formed;

oxidizing said semiconductor substrate within said opening wherein said device isolation region is formed and whereby said nitrided oxide layer suppresses the formation of a bird's beak; and removing remaining said oxide layer and said silicon nitride layer completing the fabrication of said device isolation region of said integrated circuit.

2. The method according to claim 1 wherein said oxide layer is grown in dry oxygen at a temperature of between about 850° to 950° C.

3. The method according to claim 1 wherein said oxide layer is deposited by chemical vapor deposition.

4. The method according to claim 1 wherein said oxide layer is composed of silicon dioxide and has a thickness of between about 100 to 150 Angstroms.

5. The method according to claim 1 wherein said annealing is performed in $NH_3$ at a temperature of between about 850° to 1200° C. for between about 20 to 80 minutes.

6. The method according to claim 1 wherein said annealing is performed in NO at a temperature of between about 850° to 1200° C. for between about 20 to 80 minutes.

7. The method according to claim 1 wherein said oxide layer has a thickness of between about 150 to 170 Angstroms after said oxide layer is nitrided.

8. The method according to claim 1 wherein said reoxidizing is performed in an oxygen atmosphere at a temperature of between about 850° to 950° C. for between about 10 to 50 minutes.

9. The method according to claim 1 wherein said silicon nitride layer has a thickness of between about 1500 to 2000 Angstroms.

10. The method of field oxidation of an integrated circuit wherein said field oxidation has a small bird's beak comprising:

providing an oxide layer over the surface of a semiconductor substrate;

annealing said oxide layer in a nitrogen atmosphere whereby said oxide layer is nitrided;

reoxidizing said oxide layer;

depositing a silicon nitride layer overlying said oxide layer;

etching through portions of said silicon nitride and said oxide layers not covered by a mask pattern to said semiconductor substrate so as to provide an opening exposing the portion of said semiconductor substrate that will form the said field oxidation;

oxidizing said silicon substrate within said opening wherein said semiconductor substrate is transformed to silicon dioxide wherein said nitrided oxide layer suppresses the formation of said bird's beak whereby said field oxidation is formed with a small said bird's beak; and removing remaining said oxide layer and said silicon nitride layer completing said field oxidation of said integrated circuit.

11. The method according to claim 10 wherein said oxide layer is grown in dry oxygen at a temperature of between about 850° to 950° C.

12. The method according to claim 10 wherein said oxide layer is deposited by chemical vapor deposition.

13. The method according to claim 10 wherein said oxide layer is composed of silicon dioxide and has a thickness of between about 100 to 150 Angstroms.

14. The method according to claim 10 wherein said annealing is performed in $NH_3$ at a temperature of between about 850° to 1200° C. for between about 20 to 80 minutes.

15. The method according to claim 10 wherein said annealing is performed in NO at a temperature of between about 850° to 1200° C. for between about 20 to 80 minutes.

16. The method according to claim 10 wherein said oxide layer has a thickness of between about 150 to 170 Angstroms after said nitriding.

17. The method according to claim 10 wherein said reoxidizing is performed in an oxygen atmosphere at a temperature of between about 850° to 950° C. for between about 10 to 50 minutes.

18. The method according to claim 10 wherein said silicon nitride layer has a thickness of between about 1500 to 2000 Angstroms.

19. The method of field oxidation of an integrated circuit wherein said field oxidation has a small bird's beak comprising:

growing an oxide layer in dry oxygen over the surface of a semiconductor substrate;

annealing said oxide layer in a nitrogen atmosphere whereby said oxide layer is nitrided;

reoxidizing said oxide layer;

depositing a silicon nitride layer overlying said oxide layer;

etching through portions of said silicon nitride and said oxide layers not covered by a mask pattern to said semiconductor substrate so as to provide an opening exposing the portion of said semiconductor substrate that will form said field oxidation;

oxidizing said silicon substrate within said opening wherein said semiconductor substrate is transformed to silicon dioxide wherein said nitrided oxide layer suppresses the formation of said bird's beak whereby said field oxidation is formed with a small said bird's beak; and removing remaining said oxide layer and said silicon nitride layer completing said field oxidation of said integrated circuit.

20. The method according to claim 19 wherein said oxide layer is grown at a temperature of between about 850° to 950° C.

21. The method according to claim 19 wherein said oxide layer is deposited by chemical vapor deposition.

22. The method according to claim 19 wherein said oxide layer is composed of silicon dioxide and has a thickness of between about 100 to 150 Angstroms.

23. The method according to claim 19 wherein said annealing is performed in $NH_3$ at a temperature of between about 850° to 1200° C. for between about 20 to 80 minutes.

24. The method according to claim 19 wherein said annealing is performed in NO at a temperature of between about 850° to 1200° C. for between about 20 to 80 minutes.

25. The method according to claim 19 wherein said oxide layer has a thickness of between about 150 to 170 Angstroms after said nitriding.

26. The method according to claim 19 wherein said reoxidizing is performed in an oxygen atmosphere at a temperature of between about 850° to 950° C. for between about 10 to 50 minutes.

27. The method according to claim 19 wherein said silicon nitride layer has a thickness of between about 1500 to 2000 Angstroms.

* * * * *